US006919553B2

(12) United States Patent
Zucker et al.

(10) Patent No.: US 6,919,553 B2
(45) Date of Patent: Jul. 19, 2005

(54) PHOTOELEMENT WITH PROTECTIVE LAYER, DEVICE USING SUCH PHOTOELEMENT AND PROCESS FOR ITS PRODUCTION

(75) Inventors: Freidhelm Zucker, Villingen-Schwenningen (DE); Susann Ayari, Bad Dürrheim (DE); Reiner Baas, Steinach (DE)

(73) Assignee: Deutsche Thomson-Brandt GmbH, Villingen-Schwenningen (DE)

(*) Notice: Subject to any disclaimer, the term of this patent is extended or adjusted under 35 U.S.C. 154(b) by 19 days.

(21) Appl. No.: 09/735,346

(22) Filed: Dec. 12, 2000

(65) Prior Publication Data

US 2001/0004101 A1 Jun. 21, 2001

(30) Foreign Application Priority Data

Dec. 13, 1999 (DE) .......................................... 199 60 055

(51) Int. Cl.[7] .............................................. H01L 31/00
(52) U.S. Cl. ..................................... 250/214.1; 250/216
(58) Field of Search .......................... 250/201.1, 214.1, 250/208.1, 214 R, 216, 227.11, 227.12, 237 R, 201.5; 257/100

(56) References Cited

U.S. PATENT DOCUMENTS

| | | | | |
|---|---|---|---|---|
| 3,622,419 A | * | 11/1971 | London et al. | 250/214.1 |
| 4,388,128 A | | 6/1983 | Ogawa et al. | 156/64 |
| 4,501,493 A | * | 2/1985 | Kubota | 250/201 |
| 4,523,102 A | * | 6/1985 | Kazufumi et al. | 250/578 |
| 4,697,074 A | * | 9/1987 | Ito et al. | 250/214.1 |
| 4,983,009 A | * | 1/1991 | Musk | 385/35 |
| 5,101,285 A | * | 3/1992 | Kawai et al. | 358/471 |
| 5,284,775 A | * | 2/1994 | Yafuso et al. | 250/227.11 |
| 6,246,123 B1 | * | 6/2001 | Landers et al. | 257/787 |
| 6,515,269 B1 | * | 2/2003 | Webster et al. | 250/208.1 |
| 6,627,872 B1 | * | 9/2003 | FuKamura et al. | 250/239 |
| 2004/0036081 A1 | * | 2/2004 | Okazaki | 257/99 |

FOREIGN PATENT DOCUMENTS

| | | | |
|---|---|---|---|
| DE | 199 60 055.4 | 1/2003 | |
| EP | 0662723 A1 | 7/1995 | ........... H01L/33/00 |
| EP | 1109228 A2 * | 6/2001 | ....... H01L/31/0203 |
| JP | 58-180310 * | 10/1984 | .............. 250/214.1 |

OTHER PUBLICATIONS

Patent Abstracts of Japan, vol. 9, No. 113 (P–356), and JP60–000413.
Patent Abstracts of Japan, vol. 13, No. 81 (E–719), Feb. 23, 1989, and JP63–261965.
Patent Abstracts of Japan, vol. 12, No. 285 (E–642) of Feb. 23, 1989, and JP63–060561.

* cited by examiner

Primary Examiner—Huy Mai
(74) Attorney, Agent, or Firm—Joseph S. Tripoli; Harvey D. Fried; Patricia A. Verlangieri

(57) ABSTRACT

A photoelement which is provided with a protective layer consisting of cured material and has a transparent element at a location intended for light to pass through. An object of the present invention is to propose an improved photoelement which can be produced at low cost. This is achieved according to the invention by the cured material being the transparent element.

10 Claims, 2 Drawing Sheets

PHOTOELEMENT WITH PROTECTIVE LAYER, DEVICE USING SUCH PHOTOELEMENT AND PROCESS FOR ITS PRODUCTION

FIELD OF THE INVENTION

The present invention relates to a photoelement for a device for reading from and/or writing to optical recording media, a corresponding device and a production process for the photoelement.

BACKGROUND OF THE INVENTION

The English-language abstract of JP 61-028 281 discloses a photodetector which is provided on its side intended for light to enter with a transparent colour filter element and is otherwise enclosed by means of a protective layer consisting of cured resin. The protective layer serves on the one hand as mechanical protection for the photodetector, but on the other hand also as protection against oxidation or other environmental influences potentially harmful to the photodetector.

To be regarded as a disadvantage of the known photoelement is that the colour filter element is firstly arranged on the photodetector and the resin enclosure is subsequently applied. Following these process steps, finishing work is required for removing remains of resin on the colour filter element. For this purpose, the colour filter element is polished. All in all, the production of the known photoelement is a complex and expensive procedure.

SUMMARY OF THE INVENTION

An object of the present invention is to propose a photoelement which is improved in comparison with this and, in particular, can be produced at low cost.

It is provided according to the invention that the cured material is formed as a transparent element. This has the advantage that the separate transparent element arranged at the location of the photoelement intended for light to pass through is no longer needed and, instead, the cured material is also arranged at the location of the photoelement intended for light to pass through.

As a result, at least one working step is saved in production, a smaller number of parts to be assembled are required and the overall production costs are reduced. After mounting the photoelement on a carrier element and corresponding bonding, as in the production of electrical connections, a curable material is applied to the photoelement. The curable material adapts itself to the given form, fills any cavities and subsequently cures. At least in the cured form, the curable material is transparent. The expression transparent is not necessarily restricted here to visible light, but also extends to frequency ranges going into the infrared or ultraviolet spectrum in which the photoelement is used. The photoelement itself may be both a light-detecting photoelement, usually referred to as a photodetector, and a light-generating photoelement, also known as a photodiode, light-emitting diode or laser diode. Photoelements of this type are generally provided with a protective layer, which protects against environmental influences, for example of a mechanical or chemical nature.

An advantageous development of the invention comprises fastening a further transparent element on the photoelement by means of the cured material. This has the advantage that the cured material need not have all the optical or mechanical properties required or desired at the location intended for light to pass through. These properties are assumed by the further element. Although two different materials are used, this is often the lower-cost variant, depending on the properties required. A further advantage is that the further element is fastened directly on the photoelement by means of the cured material, consequently dispensing with an additional fastening means required by the prior art. The further transparent element is, for example, an optical filter element.

The further transparent element is advantageously a small plate of a defined geometry. This has the advantage that a small plate has a stable form, independently of whatever form the cured material assumes in the not yet cured state. Depending on boundary conditions such as temperature, angle of inclination, atmospheric humidity etc., different forms, in particular curvatures, of the cured material may occur here. The stable form of the small plate also ensures mechanical protection of the photoelement. As a defined geometry, it is envisaged for example for the small plate to be formed as a plane-parallel plate. This ensures that the region intended for light to pass through has a planar surface. A wedge form of the small plate is advantageous if a certain, desired influencing of the light impinging on the photoelement or emerging from it is achieved by this geometry. A desired influencing of the light passing through is likewise achieved if the small plate has a defined curvature. For example, a parallel alignment of a divergent beam or focusing of a beam is achieved as a result. A defined grating structure, provided on the small plate, also advantageously serves for influencing the light beam passing through. For example, splitting into the primary beam and secondary beams of the first or a higher order of diffraction can be achieved. In the case of a hologram structure, more complicated splitting patterns are also feasible. The further transparent element can also be configured in some other way, within the ability of a person skilled in the art, for influencing the light passing through. This also applies to configurations of the further transparent element other than a small plate.

According to one development of the invention, the small plate has plane-parallel surfaces, the surface area of which is in each case greater than the surface area of the photoelement facing it. This has the advantage that, when there is a large surface area, the intermediate space between the small plate and the photodetector has small dimensions, seen in relative terms. The thinner the intermediate space is, the more likely it is for the small plate to adopt a parallel or virtually parallel alignment with respect to the effective surface area of the photoelement facing the small plate without any outside intervention. In this case, adjusting effort is avoided.

The curable material is advantageously a transparent adhesive. This has the advantage that this is a low-cost solution which, in combination with the further transparent element, has the required properties. Moreover, the adhesive is also chosen to be transparent for a sustained period of time.

A photoelement according to the invention is advantageously used in a device for reading from and/or writing to optical recording media. In particular when used as a photodetector, the photoelement according to the invention represents a particularly low-cost solution with which the required protection against environmental influences is nevertheless ensured and the tolerance limits imposed on the optical properties to meet operational requirements are maintained.

The process according to the invention for producing a photoelement provided with a protective layer provides that a curable material, which is transparent in the cured state, is firstly applied to the photoelement and distributed in such a way that all the parts of the photoelement to be protected are covered by it. Subsequently, the curable material is cured.

This process has the advantage that it manages with particularly few steps. The photoelement is advantageously applied to a carrier element and is bonded before the curable material is applied.

The applying and distributing operation is advantageously performed by drip-dispensing one or more drops of adhesive. This has the advantage that the process is particularly simple. The amount is metered by the number of drops and/or size of the drop and is distributed relative uniformly by means of gravity. The viscosity, dripping height, temperature, atmospheric humidity and, if appropriate, further parameters are in this case adapted to the respective conditions, such as for example the size of the photoelement, the predetermined viscosity, the temperature or atmospheric humidity, and the like. An optimum technical result, which also saves material and cost, can be achieved by appropriate adaptation.

According to one development of the present invention, after applying the curable material and before it is cured, a transparent element is applied to the curable material. This serves on the one hand for uniformly distributing the curable material, which reduces the requirements to be met by the applying operation. On the other hand, it serves for ensuring a defined surface form of the region intended for light to pass through. The transparent element also serves for the mechanical protection of the layer of material later cured. This has the advantage that the layer of cured material forms a gas-impermeable termination, while the transparent element offers mechanical protection.

The transparent element is advantageously applied by simply allowing it to drop onto the not yet cured curable material. This has the advantage that it is then a particularly simple process step.

According to another variant of the invention, the transparent element is applied to the curable material in a defined alignment. This takes place in particular in a defined position in relation to the photoelement, which is particularly appropriate whenever particular influencing of the light passing through the transparent element is to be achieved by form-shaping, surface-shaping or some other shaping of the transparent element.

It goes without saying that appropriate combinations of the features of the invention mentioned above or below, even if they are not expressly described, and developments within the ability of a person skilled in the art are likewise within the scope of the present invention. Advantageous exemplary embodiments are specified below.

DETAILED DESCRIPTION OF PREFERRED EMBODIMENTS

Figure 1:
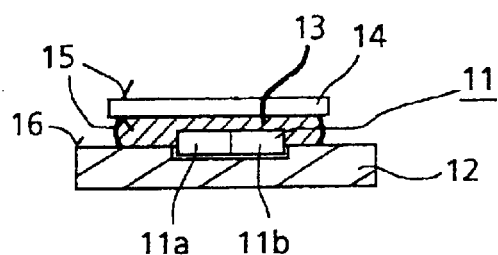
FIG. 1 shows a photoelement according to the invention in a sectioned representation.

FIG. 1 shows a photoelement 11 according to the invention in a sectioned representation. The photoelement 11 has two subelements 11a, 11b. These are fastened on a carrier element 12. Electrical contacting bonds are not shown for the sake of simplicity. The photoelement 11 is covered by a layer 13 which consists of cured material. The carrier element 12 and layer 13 consequently close off the photoelement 11 in a protective way against environmental influences. In the present exemplary embodiment, the layer 13 is a layer of cured adhesive. According to a first variant, the protective layer 13 closes off the photoelement 11 directly from the ambience; according to another variant, there is a further transparent element, here a small plate 14, above the layer 13. The small plate 14 has plane-parallel surfaces 15, which for their part are arranged parallel or virtually parallel to the surface 16 of the carrier element 12 and consequently to the surface of the photoelement 11. In this exemplary embodiment, the photoelement 11 is a photodetector, onto which light impinges from above in the illustration, after passing through the small plate 14 and the transparent layer 13. Electrical signals of the subelements 11a, 11b then induced are passed on via electrical connections (not represented here) to further components (likewise not represented here) in connection with the photoelement 11.

Figure 2:
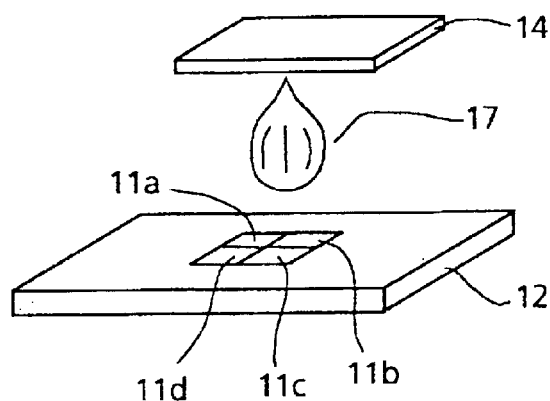
FIG. 2 shows the production of a photoelement according to the invention in a schematic three-dimensional representation.

FIG. 2 schematically shows the production of a photoelement according to the invention in a three-dimensional representation. A drop 17 of curable material is applied to the carrier element 12, in the centre of which four subelements 11a to 11d can be seen. Subsequently, a small plate 14 is likewise applied to the carrier element 12. This on the one hand ensures a uniform distribution of the curable material 17', so that all the subelements 11a to d are completely covered. On the other hand, the small plate 14 serves for ensuring a defined surface for light entering or emerging. The drop 17 consists of not yet cured adhesive, which is drip-dispensed onto the carrier element 12 from a low height. The small plate 14 is subsequently allowed to drop, likewise from a low height, onto the adhesive located on the carrier element 12.

Figure 3:
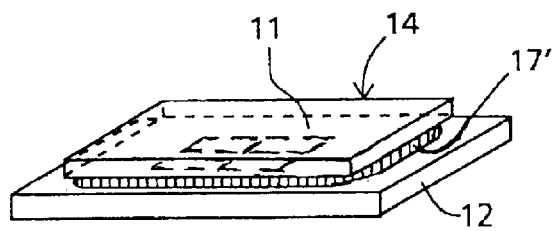
FIG. 3 shows a photoelement according to the invention in a three-dimensional representation.

FIG. 3 shows the state of the photoelement after drip-dispensing the adhesive and applying the small plate 14. The adhesive 17' is distributed relatively uniformly under the small plate 14 on the carrier element 12 and covers the photoelement 11 completely. The adhesive 17 is subsequently cured, in the simplest case by drying, but if required also at a defined temperature, under a defined atmosphere, by radiation exposure or the like.

Figure 4:
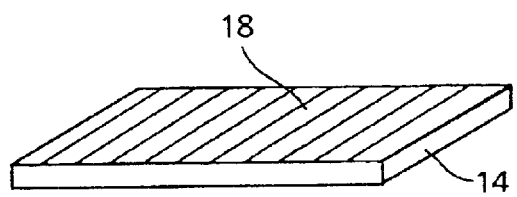
FIG. 4 shows a transparent element in a three-dimensional representation.

FIG. 4 shows a small plate 14 as a transparent element which is provided with a grating structure 18. The grating structure 18 has the effect that light falling through the small plate 14 is split into a primary beam and diffraction beams of the first or a higher order. Instead of a simple parallel grating structure 18, here, too, a more complicated structure may be provided, in order to achieve other desired influences on the light shining through.

Figure 5:
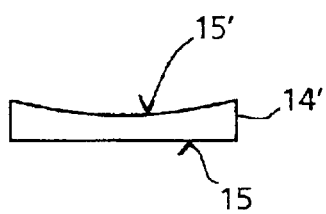
FIG. 5 shows a variant of a transparent element in a sectioned representation.

FIG. 5 shows a variant of the transparent element in a sectioned representation. In this case it is a small plate 14', the underside 15 of which is planar and the upper side 15' of which is curved. In the exemplary embodiment, the surface 15 is curved inwards; the plate 14' consequently has the properties of a dispersing lens. It goes without saying that other suitable forms of lens are also possible.

Figure 6:
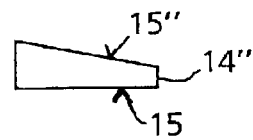
FIG. 6 shows a further variant of a transparent element in a sectioned representation.

FIG. 6 shows a further variant of a transparent element in a sectioned representation. In this case it is a wedge-shaped small plate 14", the surfaces 15, 15" of which are arranged non-parallel to one another. One of the effects of a wedge-shaped small plate 14" of this type is that it produces astigmatism in a beam of light passing through it. This property can be used both for producing and for compensating for a corresponding astigmatism.

Figure 7:
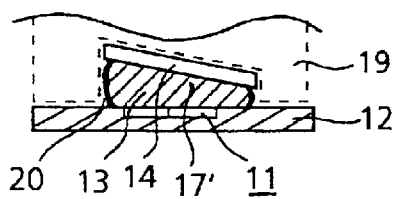
FIG. 7 shows a variant of a photoelement according to the invention in a sectioned representation.

FIG. 7 shows a variant of a photoelement 11 according to the invention in a sectioned representation. As described above, it is arranged on a carrier element 12 and is provided with a protective layer 13 consisting of adhesive. The small plate 14 is arranged in a defined geometrical position with respect to the carrier element 12 or the photoelement 11. This is achieved in the production process for example by providing a die 19, which is represented here by dashed lines and has a recess 20 bevelled to match the desired bevel in the exemplary embodiment. After applying the small plate 14, or at the same time as the small plate 14 is applied, the said die is brought up to the carrier element 12 and kept in this position until the adhesive 17' has adequately cured, in order to fix the position of the small plate 14 within the allowed tolerance. According to a variant of the invention, the die 19 is turned through 180° in comparison with FIG. 7, the small plate 14 is placed into the recess 20, the drop 17 is made to drip onto the small plate 14 and the carrier element 12 with the photoelement 11 is brought down to the die 19 from above.

Figure 8:
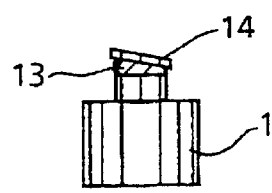
FIG. 8 shows a further variant of a photoelement according to the invention in a schematic side view.

FIG. 8 shows a further variant of a photoelement according to the invention in a schematic side view. The photoelement is in this case a laser diode 1, on the beam outlet of which a small plate 14 is arranged at an angle to the optical axis by means of a layer 13 of cured material. This arrangement serves, for example, for compensating for astigmatism in the light beam emitted by the laser diode 1. For this purpose, the astigmatism is preferably detected when the small plate 14 is applied and the orientation of the small plate 14 is changed until an optimum value is achieved.

Figure 9:
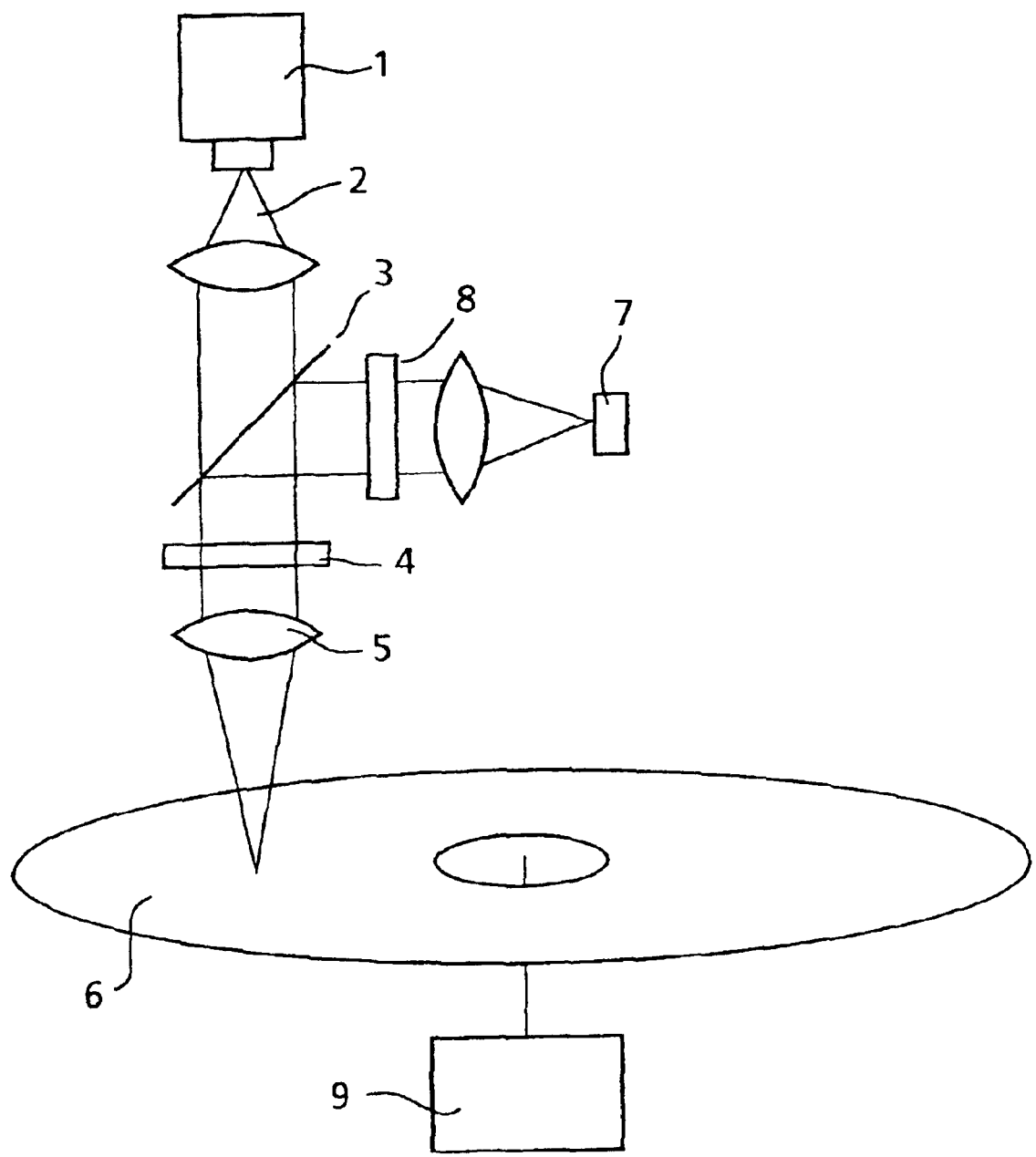
FIG. 9 shows a construction of a device according to the invention by way of example.

FIG. 9 shows a construction of a device according to the invention by way of example in a schematic representation. In this case, both the photodetector element 7 and the laser diode 1 may be equipped with a photoelement according to the invention. A laser diode 1, serving as the light source, produces a scanning beam 2, which passes through a semi-transparent mirror 3 and a grating 4 and is focused by an objective lens 5 onto an information-carrying layer of a recording medium 6. The grating 4 has in this case the effect of producing along with the primary beam of the zeroth order also secondary beams of plus/minus the first order, which cannot be seen in the schematic representation on account of the scale and serve for tracking on the basis of the 3-beam method. The scanning beam 2 is reflected from the recording medium 6, passes through the objective lens 5 and the grating 4 once again and is deflected by the semi-transparent mirror 3 onto a photodetector element 7. As it does so, it initially also passes through an astigmatism-producing element 8. The recording medium 6 is set in rotational movement by a motor 9.

According to the invention, a photoelement for a low-cost scanner of a device for reading from and/or writing to optical recording media 6 is described. In this case, a photoelement 11 which is initially not conditioned and is virtually in the state in which it was produced is used. Photoelements 11 of this type are inexpensive, but must be further protected against environmental influences. Photoelements 11 which have been protected, conditioned or provided with a so-called packaging are relatively expensive in comparison. The photoelement 11 in the unconditioned state is therefore protected according to the invention with a protective layer 13 of transparent, curable material, preferably adhesive, against influences of the ambient air. If a small transparent plate 14 is also applied in addition to the adhesive, this serves not only for the already described mechanical protection and optimization of optical properties but also as a protection for the adhesive against environmental influences. The latter may, as a result of certain wavelengths or influences of the ambient air, lead to the initially transparent, cured adhesive taking on poorer properties over time, for example reduced transparency. According to the invention, this only continues to occur at the edges of the layer 13 exposed directly to the atmosphere, which do not serve for light to pass through. To realize a plane-parallel arrangement of the small plate 14, it is envisaged according to one variant to use a die 19, which in this case has a symmetrical, not bevelled recess 20.

What is claimed is:

1. A device comprising:
   a photoelement;
   a protective layer disposed on the photoelement for protecting the photoelement against chemical influence;
   a protective element disposed on the protective layer for protecting the photoelement against mechanical influence; and wherein
   said protective layer and said protective element are combined to form a single element of cured material.

2. The device according to claim 1, wherein the single element of cured material comprises a transparent adhesive.

3. Process for producing a photoelement having a protective layer, the process comprising the steps of:
   applying a curable material, which is transparent in the cured state, to the photoelement;
   distributing the curable material in such a way that the photoelement to be protected are covered by the curable material;
   applying a transparent element to the curable material by allowing the transparent element to drop onto the curable material; and
   curing the curable material.

4. Process according to claim 3, further comprising the step of positioning said transparent element such that a substantially planar surface of said transparent element is arranged non-parallel to a surface of said photoelement.

5. Process according to claim 3, wherein the applying and distributing steps are performed by drip-dispensing one or more drops of the curable material.

6. Photoelement, comprising:
   a photoelement surface;
   a protective layer consisting of transparent cured material disposed on the photoelement surface; and
   a transparent element, fastened to said photoelement surface by said protective layer; and wherein
   said transparent element is a selected one of a wedge, a grating and a hologram.

7. Device for reading from or writing to optical recording media, said device comprising a photoelement according to claim 6.

8. The photoelement according to claim 6, wherein the protective layer is protective against chemical influence.

9. Photoelement, comprising:

a photoelement surface;

a protective layer consisting of transparent cured material disposed on the photoelement surface; and a transparent element, fastened to said photoelement surface by said protective layer; and wherein a substantially planar surface of said transparent element is arranged in a non-parallel manner with regard to said photoelement surface.

10. Device for reading from or writing to optical recording media, said device comprising a photoelement according to claim 9.

* * * * *